United States Patent
Tang et al.

(10) Patent No.: US 10,650,866 B2
(45) Date of Patent: May 12, 2020

(54) CHARGE PUMP DRIVE CIRCUIT

(71) Applicant: WUHAN XINXIN SEMICONDUCTOR MANUFACTURING CO., LTD., Hubei (CN)

(72) Inventors: Yuan Tang, San Jose, CA (US); Bin Sheng, Hubei (CN); Shengbo Zhang, Wuhan (CN); Yi Luo, Hubei (CN); Jen-Tai Hsu, San Jose, CA (US)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 18 days.

(21) Appl. No.: 16/194,761

(22) Filed: Nov. 19, 2018

(65) Prior Publication Data
US 2019/0318768 A1   Oct. 17, 2019

(30) Foreign Application Priority Data
Apr. 12, 2018   (CN) .......................... 2018 1 0326324

(51) Int. Cl.
| | | |
|---|---|---|
| G11C 5/14 | (2006.01) | |
| G11C 16/30 | (2006.01) | |
| H03K 5/24 | (2006.01) | |
| G05F 1/575 | (2006.01) | |
| H02M 3/07 | (2006.01) | |

(52) U.S. Cl.
CPC .............. *G11C 5/145* (2013.01); *G11C 5/147* (2013.01); *G11C 16/30* (2013.01); *H03K 5/2472* (2013.01); *G05F 1/575* (2013.01); *H02M 3/07* (2013.01)

(58) Field of Classification Search
CPC ......... G11C 5/145; G11C 5/147; G11C 16/30; H03K 5/2472; G05F 1/575; H02M 3/07
USPC ................................. 365/226, 230.01–243.5
See application file for complete search history.

(56) References Cited

U.S. PATENT DOCUMENTS

| | | | |
|---|---|---|---|
| 8,334,708 B1* | 12/2012 | Cha ..................... | H03K 19/0019 326/33 |
| 8,432,191 B2* | 4/2013 | Barnes ..................... | H03L 7/087 327/12 |
| 9,136,949 B1* | 9/2015 | Shih ........................ | H03L 7/0807 |

(Continued)

FOREIGN PATENT DOCUMENTS

| | | |
|---|---|---|
| CN | 101154464 A | 4/2008 |
| CN | 102270006 A | 12/2011 |
| CN | 104464803 A | 3/2015 |

*Primary Examiner* — Harry W Byrne
(74) *Attorney, Agent, or Firm* — Muncy, Geissler, Olds & Lowe, P.C.

(57) ABSTRACT

A charge pump drive circuit is disclosed. The charge pump drive circuit includes a first pulse generating circuit and a second pulse generating circuit. Each of the first pulse generating circuit and the second pulse generating circuit is configured to connect to a charge pump. The first pulse generating circuit is configured to provide the charge pump with a series of first pulse signals. The second pulse generating circuit is configured to generate a second pulse signal in response to and based on an address translation detection signal and provide the second pulse signal to the charge pump or to the first pulse generating circuit. The first pulse generating circuit generates an additional first pulse signals based on the second pulse signal.

20 Claims, 1 Drawing Sheet

(56) References Cited

U.S. PATENT DOCUMENTS

| | | | |
|---|---|---|---|
| 9,503,105 B2* | 11/2016 | Mirajkar | H03L 7/095 |
| 2012/0187989 A1* | 7/2012 | Barnes | H03L 7/087 |
| | | | 327/157 |
| 2016/0112055 A1* | 4/2016 | Mirajkar | H03L 7/095 |
| | | | 327/158 |

* cited by examiner

CHARGE PUMP DRIVE CIRCUIT

CROSS-REFERENCE TO RELATED APPLICATIONS

This application claims the priority of Chinese patent application number 201810326324.2, filed on Apr. 12, 2018, the entire contents of which are incorporated herein by reference.

TECHNICAL FIELD

The present invention relates to the field of semiconductor technology and, in particular, to a charge pump drive circuit.

BACKGROUND

A charge pump circuit is a basic block for a flash memory and greatly affects the flash memory's program/erase speed. The continuous advancement of integrated circuit (IC) fabrication technology and our relentless pursuit for lower power consumption lead to the development of ICs powered by increasingly lower supply voltages.

On the other hand, in flash memories, program/erase operations of a cell still require relatively high voltages. In such a context, more and more importance is being attached to charge pump circuits in the continuously-developing IC domain. Currently, charge pumps have become a focus of research efforts in the field of flash memory design.

A charge pump, also known as a switched-capacitor voltage converter, is a kind of DC to DC converter that uses so-called "flying" or "pumping" capacitors (rather than inductors or transformers) for energetic charge storage to raise, lower an input voltage or to produce a negative voltage. An internal field effect transistor (FET) switch array of the charge pump controls transfer of electric charges among the capacitors in a certain manner (usually, uses clock signals to control the charge/discharge of the capacitors) so that the input voltage is raised (or reduced) in a certain way to a desired output level.

When a NOR flash memory is reading, the charge pumps therein tend to experience a load current increase due to address translation, which will lead to a significant decrease in their output power. However, regulation loops in the charge pumps are not able to respond fast enough to such a sudden increase of the load current.

SUMMARY OF THE INVENTION

It is an object of the present invention to present a charge pump drive circuit to address the problem of an output power drop in conventional charge pumps upon read address translation occurring in a flash memory.

To this end, the presented charge pump drive circuit includes a first pulse generating circuit, a second pulse generating circuit and an OR gate, wherein:

the first pulse generating circuit is configured to generate a series of first pulse signals for activating a charge pump;

the second pulse generating circuit is configured to generate a second pulse signal for activating the charge pump in response to an address translation detection signal and provide the second pulse signal to the charge pump;

the OR gate has a first input coupled to the first pulse signals, a second input coupled to the second pulse signal, and an output coupled to the charge pump; and the first pulse generating circuit is further configured to receive the second pulse signal from the second pulse generating circuit and to generate an additional first pulse signal for activating the charge pump upon receipt of the second pulse signal.

Optionally, in the charge pump drive circuit, the first pulse generating circuit may comprise a voltage controlled oscillator and a control voltage generating circuit, wherein:

the control voltage generating circuit is configured to output a control voltage and provide the control voltage to the voltage controlled oscillator such that the voltage controlled oscillator outputs the first pulse signal based on the control voltage.

Optionally, in the charge pump drive circuit, each of the first pulse signals may have a frequency that is proportional to an amplitude of the control voltage.

Optionally, in the charge pump drive circuit, the control voltage generating circuit may comprise a comparator and a voltage division circuit, wherein:

the voltage division circuit is connected to an output of the charge pump and is configured to generate a feedback voltage based on an output voltage of the charge pump; the feedback voltage is coupled to an inverting input of the comparator; and the comparator further has a non-inverting input coupled to a reference voltage and an output at which the control voltage is output.

Optionally, in the charge pump drive circuit, the voltage division circuit may comprise a first resistor and a second resistor, wherein:

the first resistor is connected to the output of the charge pump at one end and to the inverting input of the comparator at the other end; and the second resistor is connected to the inverting input of the comparator at one end and grounded at the other end.

Optionally, in the charge pump drive circuit, the control voltage generating circuit may further comprise a first transistor and a second transistor, wherein:

the first transistor is implemented as a P-channel field-effect transistor with the second transistor being implemented as an N-channel field-effect transistor;

the first transistor has a source coupled to a supply voltage, a gate coupled to a drain of the second transistor and a drain coupled to the control voltage; and the second transistor has a gate coupled to the second pulse signal and a source that is grounded.

Optionally, in the charge pump drive circuit, the supply voltage may have an amplitude of 1.6-3.3 V.

Optionally, the charge pump may be configured to provide an output voltage to a flash memory, wherein the charge pump has an output connected to the flash memory.

Optionally, the charge pump drive circuit may further comprise an address translation detecting circuit connected to the flash memory, wherein upon translation of a read address of the flash memory, the address translation detecting circuit provides the address translation detection signal to the second pulse generating circuit.

The presented charge pump drive circuit further includes a first pulse generating circuit and a second pulse generating circuit, wherein:

each of the first and second pulse generating circuits is configured to connect to a charge pump;

the first pulse generating circuit is configured to provide the charge pump with a series of first pulse signals to activate the charge pump;

the second pulse generating circuit is configured to generate a second pulse signal in response to an address translation detection signal and provide the second pulse signal to the charge pump to activate the charge pump.

Optionally, in the charge pump drive circuit, the first pulse generating circuit comprises a voltage controlled oscillator and a control voltage generating circuit, the control voltage generating circuit configured to output a control voltage and provide the control voltage to the voltage controlled oscillator such that the voltage controlled oscillator outputs the first pulse signal based on the control voltage; and the first pulse signal having a frequency that is proportional to an amplitude of the control voltage.

Optionally, in the charge pump drive circuit, the control voltage generating circuit comprises a comparator and a voltage division circuit, the voltage division circuit connected to an output of the charge pump and configured to generate a feedback voltage based on an output voltage of the charge pump, the feedback voltage coupled to an inverting input of the comparator, the comparator further having a non-inverting input coupled to a reference voltage and an output at which the control voltage is output.

Optionally, in the charge pump drive circuit, the voltage division circuit comprises a first resistor and a second resistor, the first resistor connected to the output of the charge pump at one end and to the inverting input of the comparator at the other end, the second resistor connected to the inverting input of the comparator at one end and grounded at the other end.

Optionally, in the charge pump drive circuit, wherein:

the charge pump is configured to provide an output voltage to a flash memory; the charge pump has an output connected to the flash memory; and the charge pump drive circuit may comprise an address translation detecting circuit connected to the flash memory, wherein upon translation of a read address of the flash memory, the address translation detecting circuit provides the address translation detection signal to the second pulse generating circuit.

The presented charge pump drive circuit further includes a first pulse generating circuit and a second pulse generating circuit, wherein: the first pulse generating circuit is configured to connect to a charge pump and provide the charge pump with a series of first pulse signals to activate the charge pump;

the second pulse generating circuit is configured to generate a second pulse signal in response to an address translation detection signal and provide the second pulse signal to the first pulse generating circuit; and the first pulse generating circuit is further configured to generate an additional first pulse signal to activate the charge pump upon receipt of the second pulse signal.

Optionally, in the charge pump drive circuit, the first pulse generating circuit comprises a voltage controlled oscillator and a control voltage generating circuit, the control voltage generating circuit configured to output a control voltage and provide the control voltage to the voltage controlled oscillator such that the voltage controlled oscillator outputs the first pulse signal based on the control voltage; and the first pulse signal having a frequency that is proportional to an amplitude of the control voltage.

Optionally, in the charge pump drive circuit, the control voltage generating circuit comprises a comparator and a voltage division circuit, the voltage division circuit connected to an output of the charge pump and configured to generate a feedback voltage based on an output voltage of the charge pump, the feedback voltage coupled to an inverting input of the comparator, the comparator further having a non-inverting input coupled to a reference voltage and an output at which the control voltage is output.

Optionally, in the charge pump drive circuit, the voltage division circuit comprises a first resistor and a second resistor, the first resistor connected to the output of the charge pump at one end and to the inverting input of the comparator at the other end, the second resistor connected to the inverting input of the comparator at one end and grounded at the other end.

Optionally, in the charge pump drive circuit, the control voltage generating circuit further comprises a first transistor and a second transistor, the first transistor implemented as a P-channel field-effect transistor, the second transistor implemented as an N-channel field-effect transistor, the first transistor having a source coupled to a supply voltage, a gate coupled to a drain of the second transistor and a drain coupled to the control voltage, the second transistor having a gate coupled to the second pulse signal and a source that is grounded.

Optionally, in the charge pump drive circuit, the supply voltage has an amplitude of 1.6-3.3 V.

Optionally, in the charge pump drive circuit, wherein:

the charge pump is configured to provide an output voltage to a flash memory; the charge pump has an output connected to the flash memory; and the charge pump drive circuit may comprise an address translation detecting circuit connected to the flash memory, wherein upon translation of a read address of the flash memory, the address translation detecting circuit provides the address translation detection signal to the second pulse generating circuit.

In the charge pump drive circuit presented in the present invention, an address translation detection signal pulse is generated upon any address translation occurring in the flash memory. The second pulse generating circuit generates a second pulse signal in response to and based on the address translation detection signal. The second pulse signal is provided to the charge pump or to the first pulse generating circuit such that the first pulse generating circuit generates an additional first pulse signal and provides the first pulse signal to the charge pump. In this way, even when there is no enough time for the first pulse generating circuit to output a pulse during a normal operation, the charge pump can still be activated under an action of the first pulse signal excited by the second pulse signal.

Further, by coupling a first input of the OR gate to the first pulse signal, a second input of the OR gate to the second pulse signal and an output of the OR gate to the charge pump, enabling the second pulse signal itself to serve as a clock for the charge pump. As such, whenever the charge pump experiences a drive current increase due to the read address translation of the flash memory, the charge pump will be activated immediately to output a maximum power without any decrease in its output voltage.

In these figures: 10, a voltage controlled oscillator; 20, a second pulse generating circuit; 30, a charge pump; 40, a flash memory; and 50, an address translation detecting circuit.

DETAILED DESCRIPTION

The charge pump drive circuit constructed in accordance with this invention will be described below in further detail with reference to the accompanying drawings and specific embodiments. Features and advantages of the invention will be more apparent from the following detailed description, and from the appended claims. It is noted that the figures are provided in a very simplified form not necessarily presented to scale, with the only intention to facilitate convenience and clarity in explaining the embodiments of the invention.

The core concept of the present invention is to present a charge pump drive circuit to address the problem of an output power drop in conventional charge pumps upon translation of a read address of a flash memory.

To this end, the present invention provides a charge pump drive circuit, including a first pulse generating circuit and a second pulse generating circuit. Each of the first pulse generating circuit and the second pulse generating circuit is configured to connect with a charge pump. The first pulse generating circuit is configured to provide the charge pump with a series of first pulse signals. The second pulse generating circuit is configured to generate a second pulse signal in response to and based on an address translation detection signal and provide the second pulse signal to the charge pump or to the first pulse generating circuit. The first pulse generating circuit generates an additional first pulse signal based on the corresponding second pulse signal.

Figure 1:
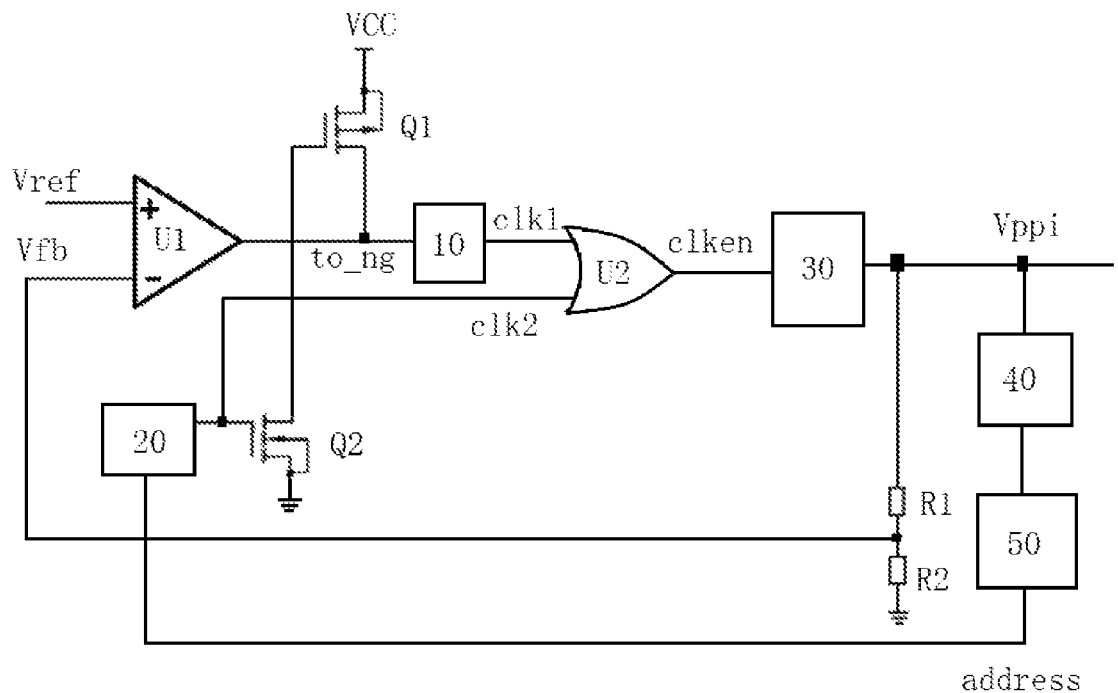
FIG. 1 is a schematic illustration of a charge pump drive circuit according to an embodiment of the present invention.

As shown in FIG. 1, this embodiment provides a charge pump drive circuit, including: a first pulse generating circuit and a second pulse generating circuit 20. Each of the first pulse generating circuit and the second pulse generating circuit 20 is configured to connect with a charge pump 30. The first pulse generating circuit is configured to provide the charge pump 30 with a series of first pulse signals clk1. The second pulse generating circuit 20 is configured to generate a second pulse signal clk2 in response to and based on an address translation detection signal ADDRESS and provide the second pulse signal to the charge pump 30 or to the first pulse generating circuit. The first pulse generating circuit generates the additional first pulse signal clk1 based on the corresponding second pulse signal clk2.

Figure 2:
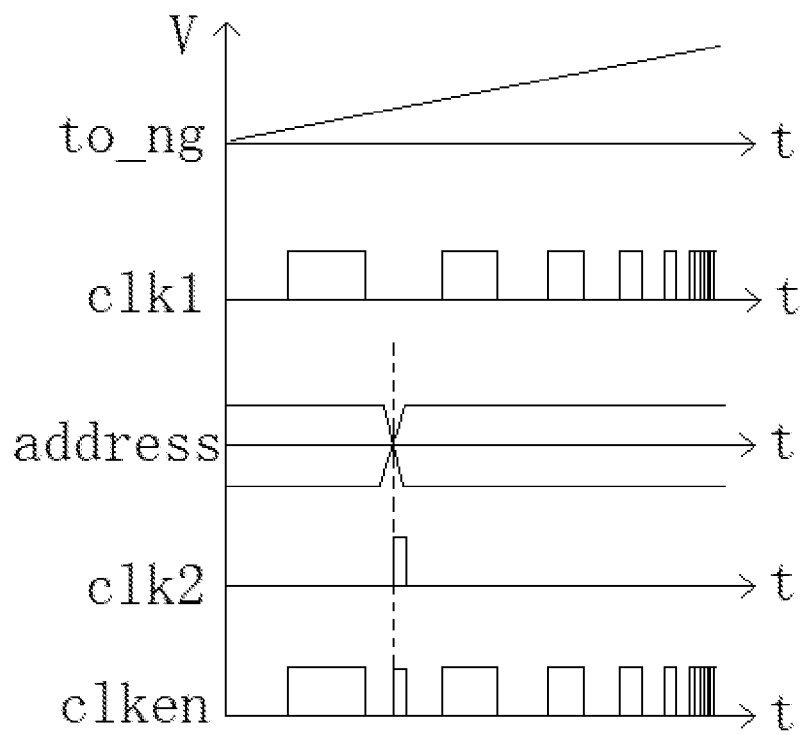
FIG. 2 schematically illustrates waveforms of a control voltage, a first pulse signal, a second pulse signal and a clock signal according to an embodiment of the present invention.

Specifically, in the charge pump drive circuit, the first pulse generating circuit may include a voltage controlled oscillator 10 and a control voltage generating circuit. The control voltage generating circuit is configured to output a control voltage to_ng and provide it to the voltage controlled oscillator 10. The voltage controlled oscillator 10 is configured to output the first pulse signal clk1 based on the control voltage to_ng. As shown in FIG. 2, each of the first pulse signals clk1 may have a frequency that is proportional to an amplitude of the control voltage to_ng. The control voltage generating circuit may include a comparator U1 and a voltage division circuit. The voltage division circuit is connected to an output of the charge pump 30 and configured to generate a feedback voltage Vfb based on an output voltage Vppi of the charge pump 30. The feedback voltage Vfb is coupled to an inverting input of the comparator U1. And the comparator U1 further has a non-inverting input coupled to a reference voltage Vref and an output at which the control voltage to_ng is output. The voltage division circuit may include a first resistor R1 and a second resistor R2. The first resistor R1 is connected to the output of the charge pump 30 at one end and to the inverting input of the comparator U1 at the other end. The second resistor R2 is connected to the inverting input of the comparator U1 at one end and grounded at the other end.

Additionally, in the charge pump drive circuit, the control voltage generating circuit may further include a first transistor Q1 and a second transistor Q2. The first transistor Q1 is implemented as a P-channel field-effect transistor with the second transistor Q2 being implemented as an N-channel field-effect transistor. The first transistor Q1 has a source coupled to a supply voltage VCC. The first transistor Q1 has a gate coupled to a drain of the second transistor Q2. The first transistor Q1 has a drain coupled to the control voltage to_ng. The second transistor Q2 has a gate coupled to the second pulse signal clk2. The second transistor Q2 has a source that is grounded. The supply voltage VCC may have an amplitude of 1.6-3.3 V.

Further, the charge pump drive circuit may further include an OR gate U2. The OR gate U2 has a first input coupled to the first pulse signal clk1. The OR gate U2 has a second input coupled to the second pulse signal clk2. The OR gate U2 has an output coupled to the charge pump 30 and is configured to provide the charge pump 30 with a clock signal clken. As shown in FIG. 2, due to the operation of the OR gate, the clock signal is a superimposition of the first pulse signal clk1 and the second pulse signal clk2.

As shown in FIG. 1, in the charge pump drive circuit, the charge pump 30 may provide the output voltage Vppi to a flash memory 40, and the output of the charge pump 30 may be connected to the flash memory 40. The charge pump drive circuit may further include an address translation detecting circuit 50 connected to the flash memory 40. Upon translation of a read address of the flash memory 40, the address translation detecting circuit 50 may provide the address translation detection signal ADDRESS to the second pulse generating circuit 20. A relationship between the address translation detection signal ADDRESS and the second pulse signal clk2 is shown in FIG. 2.

In the charge pump drive circuit presented in the present invention, an address translation detection signal pulse is generated upon any address translation in the flash memory 40. The second pulse generating circuit 20 generates a second pulse signal clk2 in response to and based on the address translation detection signal ADDRESS. The second pulse signal clk2 is provided to the charge pump 30 or to the first pulse generating circuit so that the first pulse generating circuit generates a first pulse signal clk1 and provides it to the charge pump 30. In this way, even when there is no enough time for the first pulse generating circuit to output a pulse during a normal operation, the charge pump 30 can still be activated under an action of the first pulse signal clk1 excited by the second pulse signal clk2.

Further, by coupling a first input of the OR gate U2 to the first pulse signal clk1, a second input of the OR gate to the second pulse signal clk2 and an output of the OR gate to the charge pump 30, the second pulse signal clk2 is enabled to serve as a clock for the charge pump 30. As such, whenever the charge pump 30 experiences a drive current increase due to a read address translation in the flash memory 40, the charge pump 30 will be activated immediately to output a maximum power without any decrease in its output voltage.

In summary, various configurations of the charge pump drive circuit have been detailed in the above embodiments. Of course, the present invention includes, but not limited to, the configurations disclosed above, and any and all modifications made to these configurations are considered to fall within the scope of the invention. Those skilled in the art can extend the inventive ideas in many ways.

The description presented above is merely that of some preferred embodiments of the present invention and does not limit the scope thereof in any sense. Any and all changes and modifications made by those of ordinary skill in the art based on the above teachings fall within the scope as defined in the appended claims.

What is claimed is:

1. A charge pump drive circuit, comprising a first pulse generating circuit, a second pulse generating circuit and an OR gate, wherein:
   the first pulse generating circuit is configured to generate a series of first pulse signals for activating a charge pump;
   the second pulse generating circuit is configured to generate a second pulse signal for activating the charge pump in response to an address translation detection signal and provide the second pulse signal to the charge pump;
   the OR gate has a first input coupled to the first pulse signals, a second input coupled to the second pulse signal, and an output coupled to the charge pump; and
   the first pulse generating circuit is further configured to receive the second pulse signal from the second pulse generating circuit and to generate an additional first pulse signal for activating the charge pump upon receipt of the second pulse signal.

2. The charge pump drive circuit of claim 1, wherein the first pulse generating circuit comprises a voltage controlled oscillator and a control voltage generating circuit,
   the control voltage generating circuit configured to output a control voltage and provide the control voltage to the voltage controlled oscillator such that the voltage controlled oscillator outputs the first pulse signal based on the control voltage; and
   the first pulse signal having a frequency that is proportional to an amplitude of the control voltage.

3. The charge pump drive circuit of claim 2, wherein the control voltage generating circuit comprises a comparator and a voltage division circuit,
   the voltage division circuit connected to an output of the charge pump and configured to generate a feedback voltage based on an output voltage of the charge pump, the feedback voltage coupled to an inverting input of the comparator, the comparator further having a non-inverting input coupled to a reference voltage and an output at which the control voltage is output.

4. The charge pump drive circuit of claim 3, wherein the voltage division circuit comprises a first resistor and a second resistor,
   the first resistor connected to the output of the charge pump at one end and to the inverting input of the comparator at the other end,
   the second resistor connected to the inverting input of the comparator at one end and grounded at the other end.

5. The charge pump drive circuit of claim 2, wherein the control voltage generating circuit further comprises a first transistor and a second transistor,
   the first transistor implemented as a P-channel field-effect transistor, the second transistor implemented as an N-channel field-effect transistor,
   the first transistor having a source coupled to a supply voltage, a gate coupled to a drain of the second transistor and a drain coupled to the control voltage,
   the second transistor having a gate coupled to the second pulse signal and a source that is grounded.

6. The charge pump drive circuit of claim 5, wherein the supply voltage has an amplitude of 1.6-3.3 V.

7. The charge pump drive circuit of claim 1, wherein the charge pump is configured to provide an output voltage to a flash memory, and wherein the charge pump has an output connected to the flash memory.

8. The charge pump drive circuit of claim 7, further comprising an address translation detecting circuit connected to the flash memory, wherein upon translation of a read address of the flash memory, the address translation detecting circuit provides the address translation detection signal to the second pulse generating circuit.

9. A charge pump drive circuit, comprising a first pulse generating circuit and a second pulse generating circuit, wherein:
   each of the first and second pulse generating circuits is configured to connect to a charge pump;
   the first pulse generating circuit is configured to provide the charge pump with a series of first pulse signals to activate the charge pump;
   the second pulse generating circuit is configured to generate a second pulse signal in response to an address translation detection signal and provide the second pulse signal to the charge pump to activate the charge pump.

10. The charge pump drive circuit of claim 9, wherein the first pulse generating circuit comprises a voltage controlled oscillator and a control voltage generating circuit,
    the control voltage generating circuit configured to output a control voltage and provide the control voltage to the voltage controlled oscillator such that the voltage controlled oscillator outputs the first pulse signal based on the control voltage; and
    the first pulse signal having a frequency that is proportional to an amplitude of the control voltage.

11. The charge pump drive circuit of claim 10, wherein the control voltage generating circuit comprises a comparator and a voltage division circuit,
    the voltage division circuit connected to an output of the charge pump and configured to generate a feedback voltage based on an output voltage of the charge pump, the feedback voltage coupled to an inverting input of the comparator, the comparator further having a non-inverting input coupled to a reference voltage and an output at which the control voltage is output.

12. The charge pump drive circuit of claim 11, wherein the voltage division circuit comprises a first resistor and a second resistor,
    the first resistor connected to the output of the charge pump at one end and to the inverting input of the comparator at the other end,
    the second resistor connected to the inverting input of the comparator at one end and grounded at the other end.

13. The charge pump drive circuit of claim 9, wherein:
    the charge pump is configured to provide an output voltage to a flash memory; the charge pump has an output connected to the flash memory; and the charge pump drive circuit comprises an address translation detecting circuit connected to the flash memory, wherein upon translation of a read address of the flash memory, the address translation detecting circuit provides the address translation detection signal to the second pulse generating circuit.

14. A charge pump drive circuit, comprising a first pulse generating circuit and a second pulse generating circuit, wherein:

the first pulse generating circuit is configured to connect to a charge pump and provide the charge pump with a series of first pulse signals to activate the charge pump;

the second pulse generating circuit is configured to generate a second pulse signal in response to an address translation detection signal and provide the second pulse signal to the first pulse generating circuit; and the first pulse generating circuit is further configured to generate an additional first pulse signal to activate the charge pump upon receipt of the second pulse signal.

15. The charge pump drive circuit of claim 14, wherein the first pulse generating circuit comprises a voltage controlled oscillator and a control voltage generating circuit, the control voltage generating circuit configured to output a control voltage and provide the control voltage to the voltage controlled oscillator such that the voltage controlled oscillator outputs the first pulse signal based on the control voltage; and the first pulse signal having a frequency that is proportional to an amplitude of the control voltage.

16. The charge pump drive circuit of claim 15, wherein the control voltage generating circuit comprises a comparator and a voltage division circuit, the voltage division circuit connected to an output of the charge pump and configured to generate a feedback voltage based on an output voltage of the charge pump, the feedback voltage coupled to an inverting input of the comparator, the comparator further having a non-inverting input coupled to a reference voltage and an output at which the control voltage is output.

17. The charge pump drive circuit of claim 16, wherein the voltage division circuit comprises a first resistor and a second resistor, the first resistor connected to the output of the charge pump at one end and to the inverting input of the comparator at the other end, the second resistor connected to the inverting input of the comparator at one end and grounded at the other end.

18. The charge pump drive circuit of claim 15, wherein the control voltage generating circuit further comprises a first transistor and a second transistor, the first transistor implemented as a P-channel field-effect transistor, the second transistor implemented as an N-channel field-effect transistor, the first transistor having a source coupled to a supply voltage, a gate coupled to a drain of the second transistor and a drain coupled to the control voltage, the second transistor having a gate coupled to the second pulse signal and a source that is grounded.

19. The charge pump drive circuit of claim 18, wherein the supply voltage has an amplitude of 1.6-3.3 V.

20. The charge pump drive circuit of claim 14, wherein:

the charge pump is configured to provide an output voltage to a flash memory; the charge pump has an output connected to the flash memory; and the charge pump drive circuit comprises an address translation detecting circuit connected to the flash memory, wherein upon translation of a read address of the flash memory, the address translation detecting circuit provides the address translation detection signal to the second pulse generating circuit.

* * * * *